(12) United States Patent
Lee et al.

(10) Patent No.: US 12,120,920 B2
(45) Date of Patent: Oct. 15, 2024

(54) DISPLAY DEVICE HAVING MINIMAL DECREASE IN LIGHT EMISSION EFFICIENCY WITH BANK REMOVAL

(71) Applicant: LG DISPLAY CO., LTD., Seoul (KR)

(72) Inventors: SiKyu Lee, Sungnam-si (KR); Youngho Kim, Seoul (KR); UngGi Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/100,644

(22) Filed: Jan. 24, 2023

(65) Prior Publication Data

US 2023/0165060 A1 May 25, 2023

Related U.S. Application Data

(62) Division of application No. 16/990,753, filed on Aug. 11, 2020, now Pat. No. 11,587,998.

(30) Foreign Application Priority Data

Sep. 19, 2019 (KR) .................. 10-2019-0115279

(51) Int. Cl.
*H01L 29/08* (2006.01)
*H10K 59/121* (2023.01)
(Continued)

(52) U.S. Cl.
CPC ....... *H10K 59/1216* (2023.02); *H10K 59/124* (2023.02); *H10K 59/126* (2023.02);
(Continued)

(58) Field of Classification Search
CPC ............ H10K 59/1216; H10K 59/131; H10K 59/126; H10K 59/88; H10K 59/124
(Continued)

(56) References Cited

U.S. PATENT DOCUMENTS

2014/0313112 A1* 10/2014 Madhusudan ....... G09G 3/3208
345/83
2016/0197130 A1 7/2016 Gil et al.
(Continued)

FOREIGN PATENT DOCUMENTS

CN 109728033 5/2019
KR 20140126568 A * 10/2014 ........... H10K 59/351
(Continued)

OTHER PUBLICATIONS

Chinese Office Action dated Mar. 7, 2024 issued in Patent Application No. 202010947039.X w/English Translation (13 pages).

*Primary Examiner* — Phuc T Dang
(74) *Attorney, Agent, or Firm* — POLSINELLI PC

(57) ABSTRACT

A display device includes a substrate in which a plurality of sub-pixels are defined, each of the plurality of sub-pixels including an emission area and a circuit area; a driving transistor disposed in the circuit area and including a first gate electrode and a first source electrode disposed on the same layer; a storage capacitor disposed in the circuit area and including a first capacitor electrode electrically connected to the first gate electrode and disposed below the first gate electrode; an insulating layer planarizing upper portions of the driving transistor and the storage capacitor; and a light emitting element disposed on the insulating layer.

6 Claims, 6 Drawing Sheets

(51) Int. Cl.
*H10K 59/124* (2023.01)
*H10K 59/126* (2023.01)
*H10K 59/131* (2023.01)
*H10K 59/38* (2023.01)
*H10K 59/88* (2023.01)

(52) U.S. Cl.
CPC ........... *H10K 59/131* (2023.02); *H10K 59/38* (2023.02); *H10K 59/88* (2023.02)

(58) Field of Classification Search
USPC .......................................................... 257/40
See application file for complete search history.

(56) References Cited

U.S. PATENT DOCUMENTS

| | | |
|---|---|---|
| 2016/0204180 A1 | 7/2016 | Lee et al. |
| 2016/0218155 A1 | 7/2016 | Park et al. |
| 2019/0131369 A1 | 5/2019 | Choi |

FOREIGN PATENT DOCUMENTS

| | | | | |
|---|---|---|---|---|
| KR | 20170007647 A | * | 1/2017 | ......... H10K 59/1213 |
| KR | 10-2019-0048569 A | | 5/2019 | |

* cited by examiner

DISPLAY DEVICE HAVING MINIMAL DECREASE IN LIGHT EMISSION EFFICIENCY WITH BANK REMOVAL

CROSS-REFERENCE TO RELATED APPLICATIONS

This application is a divisional of U.S. patent application Ser. No. 16/990,753, filed on Aug. 11, 2020, now U.S. Pat. No. 11,587,998, issued on Feb. 21, 2023, which claims the priority benefit of Korean Patent Application No. 10-2019-0115279 filed on Sep. 19, 2019, which are hereby incorporated by reference in their entirety for all purposes as if fully set forth herein.

BACKGROUND

Field of the Disclosure

The present disclosure relates to a display device, and more particularly, to a display device for minimizing parasitic capacitance between a storage capacitor and a cathode.

Description of the Background

Display devices used for a computer monitor, a TV, and a mobile phone include an organic light emitting display device (OLED) that emits light by itself, a liquid crystal display (LCD) device that requires a separate light source, and the like.

Such display devices are being applied to more and more various fields including not only a computer monitor and a TV, but personal mobile devices, and thus, display devices having a reduced volume and weight while having a wide display area are being studied.

Meanwhile, the display device includes a plurality of sub-pixels, and a bank disposed between the plurality of sub-pixels to reduce mixing of colors between the plurality of sub-pixels. However, an additional process is required to form the bank, and there exists a problem in which moisture penetrates into the display device through the bank formed of an organic material. Accordingly, to simplify a process and minimize moisture permeation, display devices from which such a bank is removed are being studied.

SUMMARY

Accordingly, the present disclosure provides a display device in which a decrease in light emission efficiency due to removal of a bank is minimized.

The present disclosure also provides a display device in which a parasitic capacitance between a storage capacitor and a cathode is minimized.

Further, the present disclosure provides a display device in which a leakage of light emitted from each of a plurality of sub-pixels is minimized.

The present disclosure is not limited to the above-mentioned features, which are not mentioned above, can be clearly understood by those skilled in the art from the following descriptions.

According to an aspect of the present disclosure, a display device includes a substrate in which a plurality of sub-pixels are defined, each of the plurality of sub-pixels including an emission area and a circuit area; a driving transistor disposed in the circuit area and including a first gate electrode and a first source electrode disposed on the same layer; a storage capacitor disposed in the circuit area and including a first capacitor electrode electrically connected to the first gate electrode and disposed below the first gate electrode; an insulating layer planarizing upper portions of the driving transistor and the storage capacitor; and a light emitting element disposed on the insulating layer. Therefore, a parasitic capacitance between the first capacitor electrode and the light emitting element can be minimized by disposing the first capacitor electrode electrically connected to the first gate electrode under the first gate electrode.

According to another aspect of the present disclosure, a display device includes a substrate in which a plurality of sub-pixels including a red sub-pixel, a green sub-pixel, a blue sub-pixel and a white sub-pixel are defined; a first capacitor electrode disposed in each of the plurality of sub-pixels; a driving transistor disposed in each of the plurality of sub-pixels and including a first gate electrode electrically connected to the first capacitor electrode and a first source electrode disposed on the first capacitor electrode; and a light emitting element including a plurality of anodes disposed on the driving transistor in each of the plurality of sub-pixels, and a light emitting layer and a cathode disposed on the entirety of the plurality of sub-pixels so as to cover the plurality of anodes, wherein a portion of a lower surface of the light emitting layer is disposed on a same plane as respective lower surfaces of the plurality of anodes. Therefore, it is feasible to minimize the distortion of a data signal due to a parasitic capacitance between the cathode and the storage capacitor while simplifying a process by removing the bank.

Other detailed matters of the exemplary aspects are included in the detailed description and the drawings.

According to the present disclosure, the occurrence of color coordinate distortion and light leakage through a circuit area can be minimized by minimizing anodes disposed in the circuit area.

According to the present disclosure, power consumption can be reduced and color coordinate distortion can be minimized by reducing an arrangement area of the anode in the circuit area.

According to the present disclosure, a parasitic capacitance between a first capacitor electrode and a cathode can be reduced by disposing the first capacitor electrode which is connected to a first gate electrode of a first transistor among electrodes of a storage capacitor under the first gate electrode.

According to the present disclosure, the distortion of a data signal due to a parasitic capacitance between the storage capacitor and the cathode can be minimized by disposing a plurality of color filters between the storage capacitor and the cathode.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
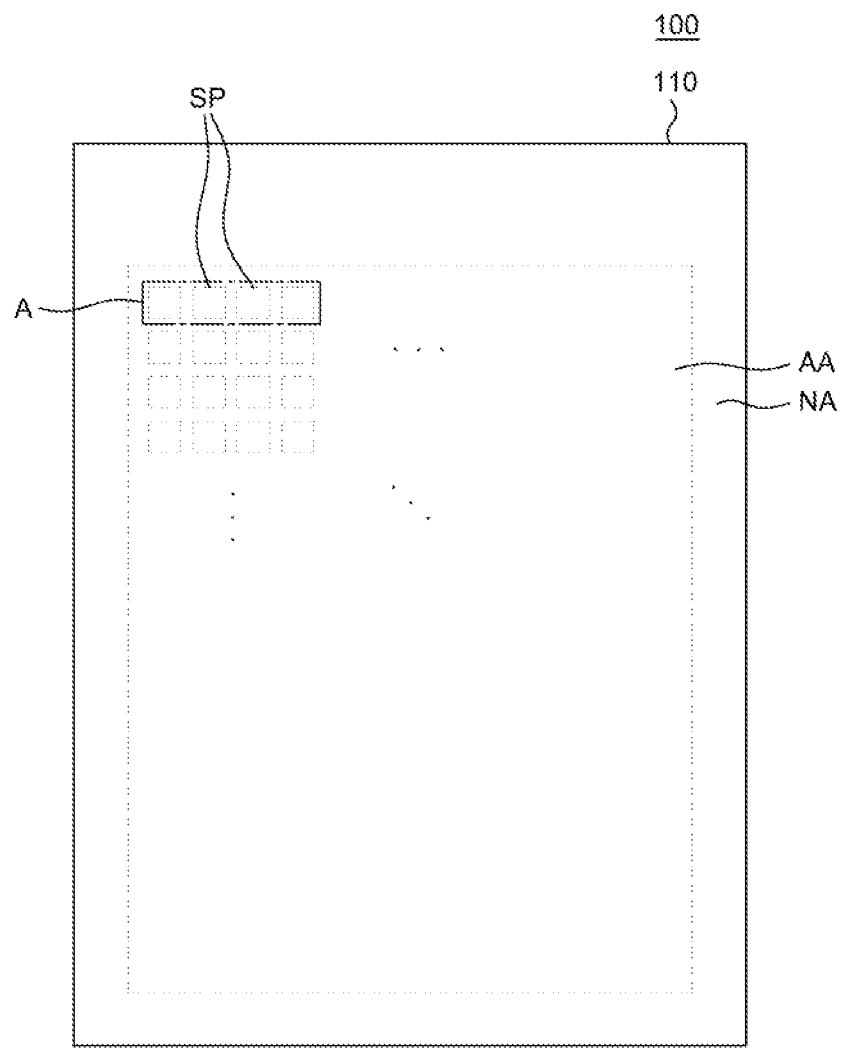
FIG. 1 is a plan view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

FIG. 1 is a plan view of a display device according to an exemplary aspect of the present disclosure. FIG. 1 illustrates only a substrate 110 and a plurality of sub-pixels SP among various components of a display device 100, for convenience of description.

The substrate 110 is a support member for supporting other components of the display device 100 and may be formed of an insulating material. For example, the substrate 110 may be formed of glass or resin. In addition, the substrate 110 may be formed of a polymer or plastic such as polyimide (PI), or may be formed of a material having flexibility.

The substrate 110 includes a display area AA and a non-display area NA.

The display area AA is an area for displaying an image. In the display area AA, the plurality of sub-pixels SP for displaying an image and a driving circuit for driving the plurality of sub-pixels SP may be disposed. The driving circuit may include various thin film transistors, storage capacitors, and lines for driving the sub-pixels SP. For example, the circuit may be formed of various components such as a driving transistor, a switching transistor, a sensing transistor, a storage capacitor, a gate line, a data line, and the like, but is not limited thereto.

The non-display area NA is an area where an image is not displayed. In the non-display area NA, various lines, driving ICs, and the like for driving the sub-pixels SP disposed in the display area AA are disposed. For example, various driving ICs such as a gate driver IC and a data driver IC may be disposed in the non-display area NA.

Meanwhile, although FIG. 1 illustrates that the non-display area NA surrounds the display area AA, the non-display area NA may be an area extending from one side of the display area AA and is not limited thereto.

The plurality of sub-pixels SP are disposed in the display area AA of the substrate 110. Each of the plurality of sub-pixels SP is an individual unit that emits light, and each of the plurality of sub-pixels SP is provided with a light emitting element and a driving circuit. For example, the plurality of sub-pixels SP may include a red sub-pixel, a green sub-pixel, a blue sub-pixel, and a white sub-pixel, but is not limited thereto.

Hereinafter, driving circuits of the plurality of sub-pixels SP will be described in detail with reference to FIG. 2.

Figure 2:
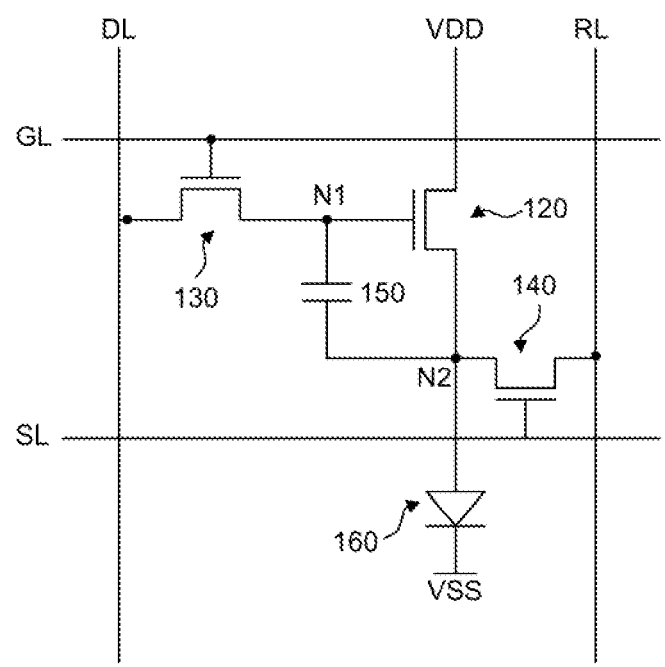
FIG. 2 is a circuit diagram of a sub-pixel of the display device according to an aspect of the present disclosure.

FIG. 2 is a circuit diagram of a sub-pixel of the display device according to an exemplary aspect of the present disclosure. With reference to FIG. 2, a driving circuit for driving light emitting elements 160 of the plurality of sub-pixels SP includes a first transistor 120, a second transistor 130, a third transistor 140, a storage capacitor 150, a gate line GL, a data line DL, a high potential power supply line VDD, a sensing line SL and a reference line RL.

With reference to FIG. 2, each of the first transistor 120, the second transistor 130, and the third transistor 140 included in the driving circuit of the sub-pixel SP includes a gate electrode, a source electrode, and a drain electrode. The first transistor 120, the second transistor 130, and the third transistor 140 may be P-type thin film transistors or N-type thin film transistors. For example, in the P-type thin film transistor, since holes flow from the source electrode to the drain electrode, a current may flow from the source electrode to the drain electrode. In the N-type thin film transistor, since electrons flow from the source electrode to the drain electrode, a current may flow from the drain electrode to the source electrode. Hereinafter, it is assumed that the first transistor 120, the second transistor 130, and the third transistor 140 are N-type thin film transistors in which a current flow from the drain electrode to the source electrode, but the present disclosure is not limited thereto.

The first transistor 120 includes a first active layer, a first gate electrode, a first source electrode, and a first drain electrode. The first gate electrode is connected to a first node N1, the first source electrode is connected to a first electrode of the light emitting element 160, and the first drain electrode is connected to a high potential power supply line VDD. The first transistor 120 is turned on when a voltage of the first node N1 is higher than a threshold voltage and is turned off when the voltage of the first node N1 is lower than the threshold voltage. In addition, when the first transistor 120 is turned on, the first transistor 120 may transmit a power signal from the high potential power supply line VDD to the light emitting element 160. The first transistor 120 may also be referred to as a driving transistor.

The second transistor 130 includes a second active layer, a second gate electrode, a second source electrode, and a second drain electrode. The second gate electrode is connected to the gate line GL, the second source electrode is connected to the first node N1, and the second drain electrode is connected to the data line DL. The second transistor 130 may be turned on or off based on a gate signal from the gate line GL. When the second transistor 130 is turned on, a data signal from the data line DL may be charged to the first node N1. The second transistor 130 may also be referred to as a switching transistor.

The third transistor 140 includes a third active layer, a third gate electrode, a third source electrode, and a third drain electrode. The third gate electrode is connected to the sensing wire SL, the third source electrode is connected to a second node N2, and the third drain electrode is connected to the reference wire RL. The third transistor 140 may be turned on or off based on a sensing signal from the sensing line SL. When the third transistor 140 is turned on, a reference voltage from the reference line RL may be transmitted to the storage capacitor 150. The third transistor 140 may also be referred to as a sensing transistor. Meanwhile, in FIG. 2, the gate line GL and the sensing line SL are illustrated as separate lines, but the gate line GL and the sensing line SL may be implemented as a single line.

The storage capacitor 150 includes a first capacitor electrode and a second capacitor electrode. The first capacitor electrode is connected to the first node N1, and the second capacitor electrode is connected to the second node N2. The storage capacitor 150 maintains a potential difference between the first gate electrode and the first source electrode of the first transistor 120 when the light emitting element 160 emits light, thereby allowing a constant current to be supplied to the light emitting element 160.

The first electrode of the light emitting element 160 is connected to the second node N2, and the second electrode is connected to a low potential power supply line VSS. The light emitting element 160 may receive a current from the first transistor 120 to emit light. At this time, a low potential power signal from the low potential power supply line may be a ground voltage.

Meanwhile, in FIG. 2, the driving circuit of the sub-pixel SP of the display device 100 according to an exemplary aspect of the present disclosure is described as having a 3T1C structure including three transistors and one storage capacitor. However, the number and connection relationship of the transistors and storage capacitors may be variously changed according to a design, and is not limited thereto.

Hereinafter, the plurality of sub-pixels SP will be described in more detail with reference to FIGS. 3 and 4.

Figure 3:
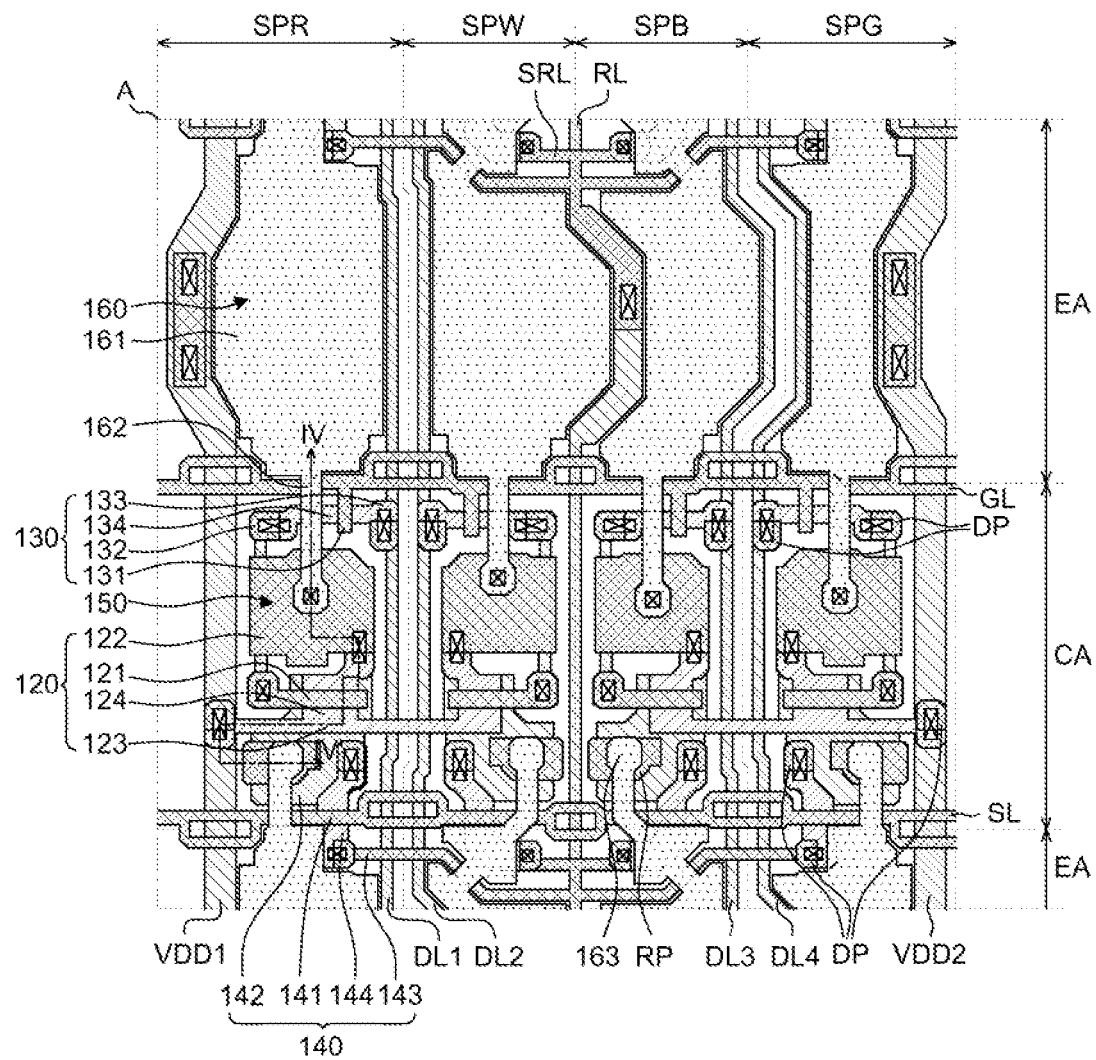
FIG. 3 is an enlarged plan view of region A of FIG. 1.

FIG. 3 is an enlarged plan view of region A of FIG. 1. FIG. 4 is a cross-sectional view taken along line IV-IV' of FIG. 3. FIG. 3 is a plan view illustrating four sub-pixels SP. With reference to FIGS. 3 and 4, the display device 100 according to an exemplary aspect of the present disclosure includes the substrate 110, the gate line GL, the data lines DL, the high potential power supply lines VDD, the sensing line SL, the reference line RL, the light emitting elements 160, the first transistors 120, the second transistors 130, the third transistors 140, the storage capacitor 150, a buffer layer 111, a gate insulating layer 112, a passivation layer 113, and a planarization layer 114. In FIG. 3, a plurality of color filters are not illustrated for convenience of illustration. In FIG. 4, only a first color filter 171 among the plurality of color filters is illustrated.

First, with reference to FIG. 3, the plurality of sub-pixels SP include a red sub-pixel SPR, a green sub-pixel SPG, a blue sub-pixel SPB, and a white sub-pixel SPW. Each of the plurality of sub-pixels SP includes an emission area and a circuit area CA.

The emission area EA is an area capable of emitting light of one color independently. The light emitting element 160 may be disposed in the emission area EA. The emission area EA of the red sub-pixel SPR is a red emission area emitting red light, the emission area EA of the green sub-pixel SPG is a green emission area emitting green light, the emission area EA of the blue sub-pixel SPB is a blue emission area emitting blue light, and the emission area EA of the white sub-pixel SPW may be a white emission area emitting white light.

The circuit area CA is an area where driving circuits for driving a plurality of the light emitting elements 160 are disposed. In the circuit area CA, the first transistor 120, the second transistor 130, the third transistor 140, and the storage capacitor 150 may be disposed.

Figure 4:
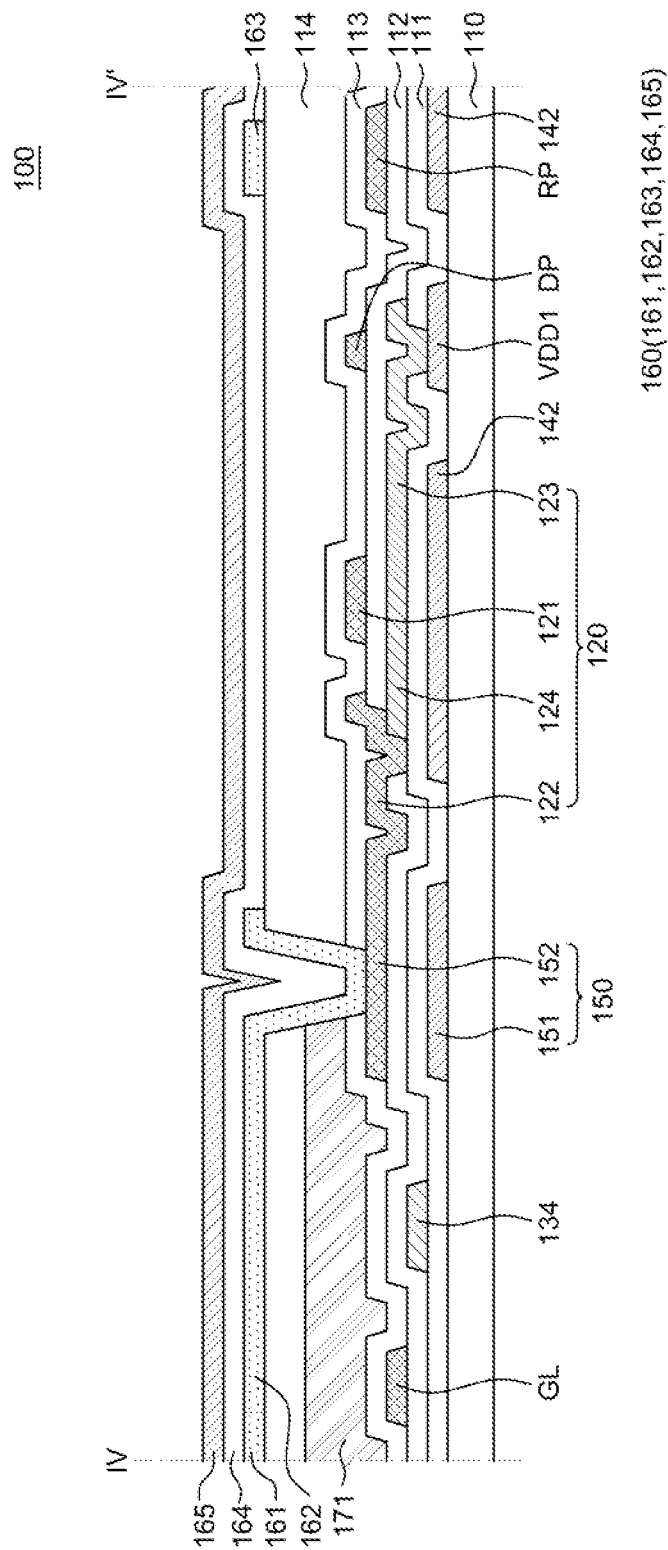
FIG. 4 is a cross-sectional view taken along line IV-IV' of FIG. 3.

With reference to FIGS. 3 and 4, a plurality of the high potential power supply lines VDD, a plurality of the data lines DL, and the reference line extending in a column direction between the plurality of sub-pixels SP are disposed on the substrate 110. The plurality of high potential power supply lines VDD, the plurality of data lines DL, and the reference line RL may be disposed on the same layer on the substrate 110, and may be formed of the same conductive material. For example, the plurality of high potential power supply lines VDD, the plurality of data lines DL and the reference line RL may be formed of a conductive material such as copper (Cu), aluminum (Al), molybdenum (Mo), nickel (Ni), titanium (Ti), chromium (Cr) or alloys thereof, but are not limited thereto.

The plurality of high potential power supply lines VDD are lines for transmitting power signals to each of the plurality of sub-pixels SP, and include a first high potential power supply line VDD1 and a second high potential power supply line VDD2. The two sub-pixels SP adjacent to each other in a row direction may share one high potential power supply line VDD of the plurality of high potential power supply lines VDD. For example, the first high potential power supply line VDD1 is disposed on the left of the red sub-pixel SPR and transmits a power signal to the first transistor 120 of the red sub-pixel SPR and the white sub-pixel SPW. The second high potential power supply line VDD2 is disposed on the right of the green sub-pixel SPG and transmits a power signal to the first transistor 120 of the blue sub-pixel SPB and the green sub-pixel SPG.

The plurality of data lines DL are lines for transmitting data signals to each of the plurality of sub-pixels SP, and include a first data line DL1, a second data line DL2, a third data line DL3, and a fourth data line DL4. The first data line DL1 is disposed between the red sub-pixel SPR and the white sub-pixel SPW, which is, on the right of the red sub-pixel SPR and transmits a data signal to the second transistor 130 of the red sub-pixel SPR. The second data line DL2 is disposed between the first data line DL1 and the white sub-pixel SPW, which is, on the left of the white sub-pixel SPW, and transmits a data signal to the second transistor 130 of the white sub-pixel SPW. The third data line DL3 is disposed between the blue sub-pixel SPB and the green sub-pixel SPG, which is, on the right of the blue sub-pixel SPB, and transmits a data signal to the second transistor 130 of the blue sub-pixel SPB. The fourth data line DL4 is disposed between the third data line DL3 and the green sub-pixel SPG, which is, on the left of the green sub-pixel SPG, and transmits a data signal to the second transistor 130 of the green sub-pixel SPG.

The reference line RL is a line for transmitting a reference signal to each of the plurality of sub-pixels SP, and may be disposed between the white sub-pixel SPW and the blue sub-pixel SPB. The plurality of sub-pixels SP constituting one pixel may share one reference line RL. The reference line RL may transmit a reference signal to the third transistors 140 of the red sub-pixel SPR, the white sub-pixel SPW, the blue sub-pixel SPB, and the green sub-pixel SPG.

The buffer layer 111 is disposed on the plurality of high potential power supply lines VDD, the plurality of data line DL, and the reference line RL. The buffer layer 111 may reduce penetration of moisture or impurities through the substrate 110. The buffer layer 111 may be formed of, for example, a single layer or multiple layers of silicon oxide (SiOx) or silicon nitride (SiNx), but is not limited thereto. The buffer layer 111 may be omitted depending on a type of the substrate 110 or types of the thin film transistors, but is not limited thereto.

The first transistor 120 is disposed in the circuit area CA of each of the sub-pixels SP. The first transistor 120 includes a first gate electrode 121, a first source electrode 122, a first drain electrode 123 and a first active layer 124. The first transistor 120 which is electrically connected to a first electrode 161 of the light emitting element 160 and the high potential power supply line VDD may be a driving transistor.

First, the first drain electrodes 123 are disposed on the buffer layer 111. The first drain electrodes 123 are electrically connected to the plurality of high potential power supply lines VDD. Specifically, the first drain electrodes 123 of the red sub-pixel SPR and the white sub-pixel SPW may be electrically connected to the first high potential power supply line VDD1 through contact holes formed in the buffer layer 111. The first drain electrodes 123 of the blue sub-pixel SPB and the green sub-pixel SPG may be electrically connected to the second high potential power supply line VDD2 through contact holes formed in the buffer layer 111.

The first active layer 124 is disposed on the buffer layer 111. The first active layer 124 may be formed of a semiconductor material such as an oxide semiconductor, amorphous silicon or polysilicon, but is not limited thereto. For example, when the first active layer 124 is formed of an oxide semiconductor, the first active layer 124 may be formed of a channel region, a source region and a drain region, and the source region and the drain region may be conductor regions. However, the present disclosure is not limited thereto.

Meanwhile, the first drain electrodes 123 of the red sub-pixel SPR and the white sub-pixel SPW may be integrally formed, and the first drain electrodes 123 of the blue sub-pixel SPB and the green sub-pixel SPG may be integrally formed. Specifically, the first drain electrode 123 of the red sub-pixel SPR and the first drain electrode 123 of the white sub-pixel SPW may be integrally formed to share one first high potential power supply line VDD1. For example, a power signal from the first high potential power supply line VDD1 may be transmitted to the first drain electrode 123 of the white sub-pixel SPW through the first drain electrode 123 of the red sub-pixel SPR. A power signal from the second high potential power supply line VDD2 may be transmitted to the first drain electrode 123 of the blue sub-pixel SPB through the first drain electrode 123 of the green sub-pixel SPG. However, the present disclosure is not limited thereto. The first drain electrode 123 of the red sub-pixel SPR and the first drain electrode 123 of the white sub-pixel SPW may be formed separately, and the first drain electrode 123 of the blue sub-pixel SPB and the first drain electrode 123 of the green sub-pixel SPG may be formed separately.

The first active layer 124 and the first drain electrode 123 of each of the plurality of sub-pixels SP may be integrally formed. For example, when a voltage is applied to the first gate electrode 121 in the red sub-pixel SPR, the first drain electrode 123 which is formed integrally with the first active layer 124 and is a conductor region, transmits a power signal from the first high potential power supply line VDD1 to the first active layer 124 and the first source electrode 122. The first drain electrode 123 may be defined as being integrated with the first high potential power supply line VDD1, but is not limited thereto.

The gate insulating layer 112 is disposed on the first active layer 124 and the first drain electrode 123. The gate insulating layer 112 is a layer for insulating the first gate electrode 121 and the first active layer 124 from each other, and may be formed of an insulating material. For example, the gate insulating layer 112 may be formed of a single layer or multilayers of silicon oxide (SiOx) or silicon nitride (SiNx), but is not limited thereto.

The first gate electrode 121 is disposed on the gate insulating layer 112 to overlap the first active layer 124 in each of the plurality of sub-pixels SP. The first gate electrode 121 may be formed of a conductive material, for example, copper (Cu), aluminum (Al), molybdenum (Mo), nickel (Ni), titanium (Ti), chromium (Cr), or alloys thereof, but is not limited thereto.

The first source electrode 122 is disposed on the gate insulating layer 112 to be spaced apart from the first gate electrode 121 in each of the plurality of sub-pixels SP. The first source electrode 122 may be electrically connected to the first active layer 124 through a contact hole formed in the gate insulating layer 112. The first source electrode 122 and the first gate electrode 121 may be disposed on the same layer and may be formed of the same conductive material. However, the present disclosure is not limited thereto. The first source electrode 122 may be formed of a conductive material, for example, copper (Cu), aluminum (Al), molybdenum (Mo), nickel (Ni), titanium (Ti), chromium (Cr), or alloys thereof, but is not limited thereto.

The second transistor 130 is disposed in the circuit area CA of each of the plurality of sub-pixels SP. The second transistor 130 includes a second gate electrode 131, a second source electrode 132, a second drain electrode 133 and a second active layer 134. The second transistor 130 which is electrically connected to the gate line GL, the data line DL, and the first gate electrode 121 of the first transistor 120 may be a switching transistor.

First, the second drain electrode 133 is disposed between the substrate 110 and the buffer layer 111 in each of the plurality of sub-pixels SP. The second drain electrode 133 is electrically connected to one data line DL of the plurality of data lines DL. The second drain electrodes 133 may be integrally formed with the plurality of data lines DL and may be formed of the same conductive material as the plurality of data lines DL. For example, the second drain electrode 133 of the red sub-pixel SPR may be integrally formed with the first data line DL1, the second drain electrode 133 of the white sub-pixel SPW may be integrally formed with the second data line DL2, the second drain electrode 133 of the blue sub-pixel SPB may be integrally formed with the third data line DL3, and the second drain electrode 133 of the green sub-pixel SPG may be integrally formed with the fourth data line DL4. The second drain electrode 133 may be formed of a conductive material, for example, copper (Cu), aluminum (Al), molybdenum (Mo), nickel (Ni), titanium (Ti), chromium (Cr), or alloys thereof, but is not limited thereto.

The second source electrode 132 is disposed to be spaced apart from the second drain electrode 133 between the substrate 110 and the buffer layer 111 in each of the plurality of sub-pixels SP. The second source electrode 132 and the second drain electrode 133 may be disposed on the same layer and may be formed of the same conductive material. However, the present disclosure is not limited thereto. The second source electrode 132 may be formed of a conductive material, for example, copper (Cu), aluminum (Al), molybdenum (Mo), nickel (Ni), titanium (Ti), chromium (Cr), or alloys thereof, but is not limited thereto.

The second active layer 134 is disposed between the buffer layer 111 and the gate insulating layer 112 in each of the plurality of sub-pixels SP. The second active layer 134 may be electrically connected to the second source electrode 132 and the second drain electrode 133 through contact holes formed in the buffer layer 111. The second active layer 134 may be formed of a semiconductor material such as an oxide semiconductor, amorphous silicon or polysilicon, but is not limited thereto.

The second gate electrode 131 is disposed on the gate insulating layer 112 to overlap the second active layer 134 in each of the plurality of sub-pixels SP. The second gate electrode 131 may be formed of a conductive material, for example, copper (Cu), aluminum (Al), molybdenum (Mo), nickel (Ni), titanium (Ti), chromium (Cr), or alloys thereof, but is not limited thereto.

The second gate electrode 131 extends from the gate line GL. Therefore, the second gate electrode 131 and the gate line GL may be formed of the same conductive material. The gate line GL may be formed of a conductive material, for example, copper (Cu), aluminum (Al), molybdenum (Mo), nickel (Ni), titanium (Ti), chromium (Cr) or alloys thereof, but is not limited thereto.

The gate line GL is a line that transmits a gate signal to each of the plurality of sub-pixels SP. The gate line GL traverses the plurality of sub-pixels SP and extends in a row direction. For example, the gate line GL is disposed to extend in the row direction between the circuit area CA and the emission area EA of each of the plurality of sub-pixels SP, and intersects with the plurality of high-potential power lines VDD, the plurality of data lines DL, and the reference line RL that extend in the column direction.

The third transistor 140 is disposed in the circuit area CA of each of the sub-pixels SP. The third transistor 140 includes a third gate electrode 141, a third source electrode 142, a third drain electrode 143 and a third active layer 144. The third transistor 140 which is electrically connected to the reference line RL, the sensing line SL, and a second capacitor electrode 152 of the storage capacitor 150 may be a sensing transistor.

First, the third source electrode 142 is disposed between the substrate 110 and the buffer layer 111 in each of the plurality of sub-pixels SP. The third source electrode 142 is disposed on the same layer as and is formed of the same conductive material as the plurality of high potential power supply lines VDD, the plurality of data lines DL, and the reference line RL. The third source electrode 142 may be formed of a conductive material, for example, copper (Cu), aluminum (Al), molybdenum (Mo), nickel (Ni), titanium (Ti), chromium (Cr) or alloys thereof, but is not limited thereto.

The third source electrode 142 may be electrically connected to the first source electrode 122. Specifically, the third source electrode 142 extends toward the first source electrode 122 to be in contact with a portion of the first active layer 124 that overlaps the first source electrode 122, thereby being electrically connected to the first source electrode 122. In addition, the third source electrode 142 may also be electrically connected to the second capacitor electrode 152 constituting the storage capacitor 150, which will be described later.

Meanwhile, the third source electrode 142 may function as a light blocking layer blocking light incident to the first active layer 124 of the first transistor 120. For example, when light is irradiated on the first active layer 124, leakage current may occur and thus, reliability of the first transistor 120 may be lowered. In this case, the third source electrode 142 formed of a non-transparent conductive material is disposed under the first active layer 124 and the first gate electrode 121 to thereby block light incident onto the first active layer 124 from a bottom portion of the substrate. Thus, reliability of the first transistor 120 can be improved.

The third active layer 144 is disposed between the buffer layer 111 and the gate insulating layer 112 in each of the plurality of sub-pixels SP. The third active layer 144 may be electrically connected to the third source electrode 142 through a contact hole formed in the buffer layer 111, and may be electrically connected to the third drain electrode 143 through a contact hole formed in the gate insulating layer 112. The third active layer 144 may be formed of a semiconductor material such as an oxide semiconductor, amorphous silicon or polysilicon, but is not limited thereto.

The third gate electrode 141 is disposed on the gate insulating layer 112 to overlap the third active layer 144 in each of the plurality of sub-pixels SP. The third gate electrode 141 is electrically connected to the sensing line SL. The third gate electrode 141 may be integrally formed with the sensing line SL, and may be formed of the same conductive material as the sensing line SL. The third gate electrode 141 may be formed of a conductive material, for example, copper (Cu), aluminum (Al), molybdenum (Mo), nickel (Ni), titanium (Ti), chromium (Cr) or alloys thereof, but is not limited thereto.

The sensing line SL is a line that transmits a sensing signal to each of the plurality of sub-pixels SP, and extends in the row direction between the plurality of sub-pixels SP. For example, the sensing line SL may be disposed to extend in the row direction at a boundary between the plurality of sub-pixels SP and intersect with the plurality of high potential power supply lines VDD, the plurality of data lines DL and the reference line RL that extend in the column direction.

The third drain electrode 143 is disposed on the gate insulating layer 112 in each of the plurality of sub-pixels SP. The third drain electrode 143 may be electrically connected to the third active layer 144 through a contact hole formed in the gate insulating layer 112. The third drain electrode 143 may be formed of a conductive material, for example, copper (Cu), aluminum (Al), molybdenum (Mo), nickel (Ni), titanium (Ti), chromium (Cr) or alloys thereof, but is not limited thereto.

The third drain electrode 143 is electrically connected to the reference line RL through an auxiliary reference line SRL. The plurality of sub-pixels SP constituting one pixel may share one reference line RL. In this case, in order to transmit a reference signal from the reference line RL to each of the plurality of sub-pixels SP, the auxiliary reference line SRL which is electrically connected to the reference line RL and extends in the row direction may be disposed. The auxiliary reference line SRL may be electrically connected to the reference line RL extending in the column direction between the white sub-pixel SPW and the blue sub-pixel SPB through contact holes formed in the buffer layer 111 and the gate insulating layer 112. In addition, the auxiliary reference line SRL may extend in the row direction from the reference line RL and be electrically connected to the third drain electrode 143 of each of the plurality of sub-pixels SP. The auxiliary reference line SRL is integrally formed with the third drain electrode 143 and may be formed of the same conductive material. The auxiliary reference line SRL may be formed of a conductive material, for example, copper (Cu), aluminum (Al), molybdenum (Mo), nickel (Ni), titanium (Ti), chromium (Cr) or alloys thereof, but is not limited thereto.

The storage capacitor 150 is disposed in the circuit area CA of each of the sub-pixels SP. The storage capacitor 150 may store a voltage between the first gate electrode 121 and the first source electrode 122 of the first transistor 120 so that the light emitting element 160 continuously maintains the same state during one frame period. The storage capacitor 150 includes a first capacitor electrode 151 and the second capacitor electrode 152.

The first capacitor electrode 151 is disposed between the substrate 110 and the buffer layer 111 in each of the plurality of sub-pixels SP. Among conductive components disposed on the substrate 110, the first capacitor electrode 151 may be disposed closest to the substrate 110. The first capacitor electrode 151 may be integrally formed with the second source electrode 132 and electrically connected to the second source electrode 132. In addition, the first capacitor electrode 151 may be electrically connected to the first gate electrode 121 through a contact hole formed in the buffer layer 111. That is, the second source electrode 132 of the second transistor 130 and the first gate electrode 121 of the first transistor 120 may be electrically connected to each other through the first capacitor electrode 151. The first capacitor electrode 151 integrally formed with the second source electrode 132 may be formed of the same material as the second source electrode 132. The first capacitor electrode 151 may be formed of a conductive material, for example, copper (Cu), aluminum (Al), molybdenum (Mo), nickel (Ni), titanium (Ti), chromium (Cr) or alloys thereof, but is not limited thereto.

In this case, the first capacitor electrode 151 is disposed below the first gate electrode 121 and the first source electrode 122. The first capacitor electrode 151 is disposed to overlap the first source electrode 122.

The second capacitor electrode 152 is disposed on the gate insulating layer 112 in each of the plurality of sub-pixels SP. The second capacitor electrode 152 may be disposed on the first capacitor electrode 151 so as to overlap the first capacitor electrode 151. The second capacitor electrode 152 may be integrally formed with the first source electrode 122 and electrically connected to the first source electrode 122. A portion of the first source electrode 122, overlapping the first capacitor electrode 151, may be defined as the second capacitor electrode 152. The second capacitor electrode 152 integrally formed with the first source electrode 122 may be formed of the same material as the first source electrode 122. The second capacitor electrode 152 may be formed of a conductive material, for example, copper (Cu), aluminum (Al), molybdenum (Mo), nickel (Ni), titanium (Ti), chromium (Cr) or alloys thereof, but is not limited thereto.

In summary, the first capacitor electrode 151 of the storage capacitor 150 may be integrally formed with the second source electrode 132, and may be electrically connected to the first gate electrode 121 of the first transistor 120 and the second source electrode 132 of the second transistor 130. In addition, the second capacitor electrode 152 may be integrally formed with the first source electrode 122 and may be electrically connected to the first source electrode 122 of the first transistor 120 and the third source electrode 142 of the third transistor 140.

Next, the passivation layer 113 is disposed on the first transistors 120, the second transistors 130, the third transistors 140, the storage capacitor 150, the plurality of high potential power supply lines VDD, the plurality of data lines DL, the reference line RL, the gate line GL, and the sensing line SL. The passivation layer 113 is an insulating layer for protecting components under the passivation layer 113. For example, the passivation layer 113 may be formed of a single layer or multiple layers of silicon oxide (SiOx) or silicon nitride (SiNx), but is not limited thereto. Also, the passivation layer 113 may be omitted depending on aspects.

A plurality of color filters are disposed on the passivation layer 113. Specifically, a plurality of color filters may be disposed between the planarization layer 114 and the passivation layer 113. The plurality of color filters include the first color filter 171, a second color filter, and a third color filter. For example, the first color filter 571 may be a red color filter, the second color filter may be a blue color filter, and the third color filter may be a green color filter.

The first color filter 171 is disposed between the substrate 110 and the planarization layer 114 in the emission area EA of one sub-pixel SP of the plurality of the sub-pixels SP. For example, the first color filter 171 is a red color filter, and the first color filter 171 may be disposed between the substrate 110 and the planarization layer 114 in the emission area EA of the red sub-pixel SPR.

Although not shown in FIGS. 3 and 4, the second color filter may be disposed between the substrate 110 and the planarization layer 114 in the emission area EA of another sub-pixel SP of the plurality of sub-pixels SP. For example, the second color filter is a blue color filter, and the second color filter may be disposed between the substrate 110 and the planarization layer 114 in the emission area EA of the blue sub-pixel SPB.

In addition, although not shown in FIGS. 3 and 4, the third color filter may be disposed between the substrate 110 and the planarization layer 114 in the emission area EA of another sub-pixel SP of the plurality of sub-pixels SP. For example, the third color filter is a green color filter, and the third color filter may be disposed between the substrate 110 and the planarization layer 114 in the emission area EA of the green sub-pixel SPG.

The planarization layer 114 is disposed on the passivation layer 113 and the plurality of color filters. The planarization layer 114 is an insulating layer for planarizing an upper portion of the substrate 110, on which the first transistors 120, the second transistors 130, the third transistors 140, the storage capacitor 150, the plurality of high potential power supply lines VDD, the plurality of data lines DL, the reference line RL, the gate line GL, and the sensing line SL are disposed. The planarization layer 114 may be formed of an organic material and may be formed of, for example, a single layer or multilayers of polyimide or photo acryl. However, the present disclosure is not limited thereto.

The light emitting element 160 is disposed in each of the plurality of sub-pixels SP. The light emitting element 160 is disposed on the planarization layer 114 in each of the plurality of sub-pixels SP. The light emitting element 160 includes the first electrode 161, a light emitting layer 164, and a second electrode 165.

The first electrode 161 is disposed on the planarization layer 114 in the emission area EA. Since the first electrode 161 supplies holes to the light emitting layer 164, the first electrode 161 may be formed of a conductive material having a high work function and may be referred to as an anode. The first electrode 161 may be formed of, for example, a transparent conductive material such as indium tin oxide (ITO), indium zin oxide (IZO), but is not limited thereto.

Meanwhile, when the display device 100 according to an exemplary aspect of the present disclosure is a top emission type, a reflective layer formed of a metal material having excellent reflection efficiency, for example, aluminum (Al) or silver (Ag), may be added to a lower portion of the first electrode 161 so that light emitted from the light emitting layer 164 is reflected on the first electrode 161 to be directed in an upward direction, that is, to the second surface 165. On the contrary to this, when the display device 100 is a bottom emission type, the first electrode 161 may be formed of only a transparent conductive material. Hereinafter, it will be described on the assumption that the display device 100 according to an exemplary aspect of the present disclosure is the bottom emission type.

The light emitting layer 164 is disposed on the first electrode 161 in the emission area EA and the circuit area CA. The light emitting layer 164 may be formed as a single layer throughout the plurality of sub-pixels SP. That is, respective light emitting layers 164 of the plurality of sub-pixels SP may be connected to each other and integrally formed. The light emitting layer 164 may be configured as a single light emitting layer 164 or may have a structure in which a plurality of light emitting layers 164 emitting light of different colors are stacked. The light emitting layer 164 may further include an organic layer such as a hole injection layer, a hole transport layer, an electron transport layer, and an electron injection layer.

The second electrode 165 is disposed on the light emitting layer 164 in the emission area EA and the circuit area CA. Since the second electrode 165 supplies electrons to the light emitting layer 164, the second electrode 165 may be formed of a conductive material having a low work function and may be referred to as a cathode. The second electrode 165 may be formed as a single layer throughout the plurality of sub-pixels SP. That is, respective second electrodes 165 of the plurality of sub-pixels SP may be connected to each other and integrally formed. The second electrode 165 may be formed of a transparent conductive material such as indium tin oxide (ITO), indium zinc oxide (IZO) or the like, or an alloy of ytterbium (Yb), and may further include a metal-doped layer. However, the present disclosure is not limited thereto. Meanwhile, although not shown in FIGS. 3 and 4, the second electrode 165 of the light emitting element 160 may be electrically connected to the low potential power supply line VSS to thereby be supplied with a low potential power signal.

The light emitting element 160 includes an extension portion 162 extending from the first electrode 161 toward the circuit area CA. The extension portion 162 extends from the first electrode 161 of the emission area EA toward the first source electrode 122 of the circuit area CA, and may be electrically connected to the first source electrode 122 through contact holes formed in the planarization layer 114 and the passivation layer 113. Therefore, the first electrode 161 of the light emitting element 160 may be electrically connected to the first source electrode 122 of the first transistor 120 and the second capacitor electrode 152 of the storage capacitor 150 through the extension portion 162.

The light emitting element 160 further includes a repair portion 163 extending from the first electrode 161 disposed in one sub-pixel SP of the plurality of sub-pixels SP toward the circuit area CA of another sub-pixel SP adjacent to the one sub-pixel SP. The repair portion 163 extends toward the circuit area CA of another sub-pixel SP emitting light of the same color as the one sub-pixel SP among the sub-pixels SP adjacent to the one sub-pixel SP. For example, the repair portion 163 of one red sub-pixel SPR may extend toward the circuit area CA of another red sub-pixel SPR adjacent to the one red sub-pixel SPR in a vertical direction. The repair portion 163 may extend toward the third source electrode 142 of the third transistor 140 in the circuit area CA of the adjacent sub-pixel SP. The repair portion 163 may overlap the third source electrode 142 with the planarization layer 114 and the passivation layer 113 interposed therebetween.

If a defect occurs in the plurality of transistors and the storage capacitor 150 in the circuit area CA, a laser may be irradiated to the repair portion 163 extending toward the third source electrode 142 of the adjacent sub-pixel SP, whereby the repair portion 163 and the third source electrode 142 of the adjacent sub-pixel SP may be electrically connected to each other. In this case, the third source electrode 142 may be electrically connected between the first source electrode 122 of the first transistor 120 and the first electrode 161 of the light emitting element 160, that is, at points where a current supplied from the first transistor 120 to the light emitting element 160 flows. Therefore, even if a defect occurs in the driving circuit, the first transistor 120 and the repair portion 163 can be electrically connected to each other through the third source electrode 142 of the adjacent sub-pixel SP, and two light emitting elements 160 can be driven by one driving circuit. Meanwhile, in the drawings, the repair portion 163 is illustrated as overlapping the third source electrode 142. However, the repair portion 163 may overlap the first transistor 120, but is not limited thereto.

A repair pattern RP is disposed between the repair portion 163 and the third source electrode 142. The repair pattern RP is formed on the same layer as and formed of the same material as the first drain electrode 123, the first gate electrode 121, and the gate line GL. An island-shaped repair pattern RP is disposed to overlap the third source electrode 142 and the repair portion 163. If a defect occurs in the driving circuit, a laser may be irradiated to the repair portion 163, whereby the repair portion 163, the repair pattern RP, and the third source electrode 142 may be electrically connected to one another. In this case, a plurality of insulating layers such as the buffer layer 111, the gate insulating layer 112, the passivation layer 113, and the planarization layer 114 are disposed between the third source electrode 142 and the repair portion 163. And, the repair pattern RP may be further disposed between the third source electrode 142 and the repair portion 163 to thereby easily connect the third source electrode 142 and the repair portion 163 to each other. However, the repair portion 163 and the repair pattern RP may be omitted depending on a design, and are not limited thereto.

Meanwhile, a dummy pattern DP formed of the same material as the gate line GL is disposed on some contact holes of the plurality of contact holes, the high potential power supply lines VDD, and the reference line RL. An island-shaped dummy pattern DP may be disposed to overlap the high potential power supply lines VDD, the reference line RL, or the contact holes. The dummy pattern DP is a pattern formed in a mask design, and an arrangement of the dummy pattern DP may be changed according to the mask design, but is not limited thereto.

In the display device 100 according to an exemplary aspect of the present disclosure, by disposing the extension portion 162, power consumption of the light emitting element 160 may be reduced, and color coordinate distortion may be minimized. First, the light emitting layer 164 and the second electrode 165 are disposed in the entirety of the emission area and the circuit area CA. The light emitting layer 164 is disposed in the entirety of the emission area EA and the circuit area CA. However, light may not be emitted from the entire light emitting layer 164 and may be emitted from only a portion of the light emitting layer 164 that overlaps the second electrode 165 and the first electrode 161. In this case, when the first electrode 161 is disposed in the entire circuit area CA, light is also emitted from the circuit area CA, and thus, the power consumption and light quantity of the light emitting element 160 may increase. However, since the display device 100 according to an exemplary aspect of the present disclosure is the bottom emission type, even when light is emitted from the circuit area CA, the light is blocked by the plurality of transistors and the storage capacitor 150 disposed in the circuit area CA. Thus, light extraction efficiency is lowered. In addition, when an image is implemented using light emitted from the emission area EA, unintended light is emitted from the circuit area CA, that is, light leakage may occur to thereby cause color coordinate distortion. Therefore, only the extension portion 162 electrically connected to the first electrode 161 is minimally disposed in the circuit area CA, whereby light emission in the circuit area CA can be minimized, and the power consumption and color coordinate distortion of the light emitting element 160 can be reduced.

The repair portion 163 is further disposed in the display device 100 according to an exemplary aspect of the present disclosure, whereby two light emitting elements 160 can be driven with one driving circuit when the other driving circuit is defective. The repair portion 163 extends from the first electrode 161 disposed in one sub-pixel SP of the plurality of sub-pixels SP toward the circuit area CA of another sub-pixel SP emitting light of the same color as the one sub-pixel SP among the sub-pixels SP adjacent to the one sub-pixel SP. The repair portion 163 may extend toward the third source electrode 142 of the third transistor 140 in the circuit area CA of the adjacent sub-pixel SP and overlap the third source electrode 142. If a defect occurs in the plurality of transistors and the storage capacitor 150 in the circuit area CA, a laser is irradiated to the repair portion 163 extending toward the third source electrode 142 of the adjacent sub-pixel SP, whereby the repair portion 163 and the third source electrode 142 of the adjacent sub-pixel SP may be electrically connected to each other. In this case, since the third source electrode 142 is electrically connected to the points where a current supplied from the first transistor 120 to the light emitting element 160 flows, even if a defect occurs in the driving circuit, the third source electrode 142 of the adjacent sub-pixel SP and the repair portion 163 are electrically connected to each other to thereby drive two light emitting elements 160 with one driving circuit. Accordingly, in the display device 100 according to an exemplary aspect of the present disclosure, even if a defect occurs in the driving circuit, the respective light emitting elements 160 of the plurality of sub-pixels SP may be driven, thereby minimizing a decrease in light efficiency.

Meanwhile, the storage capacitor 150 maintains a potential difference between the first gate electrode 121 and the first source electrode 122 of the first transistor 120 to thereby allow the light emitting element 160 to be supplied with a constant current. In addition, to supply a constant current to the light emitting element 160, it is important to maintain a voltage in the first capacitor electrode 151 connected to the first gate electrode 121 of the storage capacitor 150. However, when the first capacitor electrode 151 is disposed to be adjacent to the second electrode 165 of the light emitting element 160 connected to the low potential power supply line VSS, parasitic capacitance increases between the first capacitor electrode 151 and the second electrode 165, so that a data signal from the data line DL may be distorted.

In the prior art, after forming a bank at a boundary between an entire circuit area and an emission area, a second electrode is formed on the bank, so that the second electrode and a first capacitor electrode may be disposed to be spaced apart from each other by a distance sufficient to reduce parasitic capacitance. Meanwhile, the display device 100 according to an exemplary aspect of the present disclosure is a display device 100 allowing for a simplified process by removing the bank. Thus, in the display device 100, as the bank is removed, a distance between the first capacitor electrode 151 and the second electrode 165 may be shortened, thereby causing a parasitic capacitance problem.

Accordingly, in the display device 100 according to an exemplary aspect of the present disclosure, the first capacitor electrode 151 is disposed closest to the substrate 110 among conductive components disposed on the substrate 110, whereby the parasitic capacitance between the first capacitor electrode 151 and the second electrode 165 may be minimized. Specifically, the distance between the first capacitor electrode 151 and the second electrode 165 may be increased by disposing the first capacitor electrode 151 to be closest to the substrate 110. First, on the substrate 110, the first capacitor electrode 151 is disposed together with the high potential power supply lines VDD, the plurality of data lines DL, and the reference line RL. In addition, the buffer layer 111 and the gate insulating layer 112 are disposed on the first capacitor electrode 151, and the first source electrode 122 serving as the second capacitor electrode 152 is disposed on the gate insulating layer 112. In addition, after the passivation layer 113 and the planarization layer 114 are disposed on the first source electrode 122, the second electrode 165 may be disposed on the planarization layer 114. That is, since the plurality of insulating layers and the second capacitor electrode 152 are disposed between the first capacitor electrode 151 and the second electrode 165, the distance between the first capacitor electrode 151 and the second electrode 165 may increase. Accordingly, in the display device 100 according to an exemplary aspect of the present disclosure, by disposing the first capacitor electrode 151 to be closest to the substrate 110, the parasitic capacitance between the first capacitor electrode 151 and the second electrode 165 may be minimized, and the current flowing to the light emitting element 160 may be stably maintained.

Figure 5:
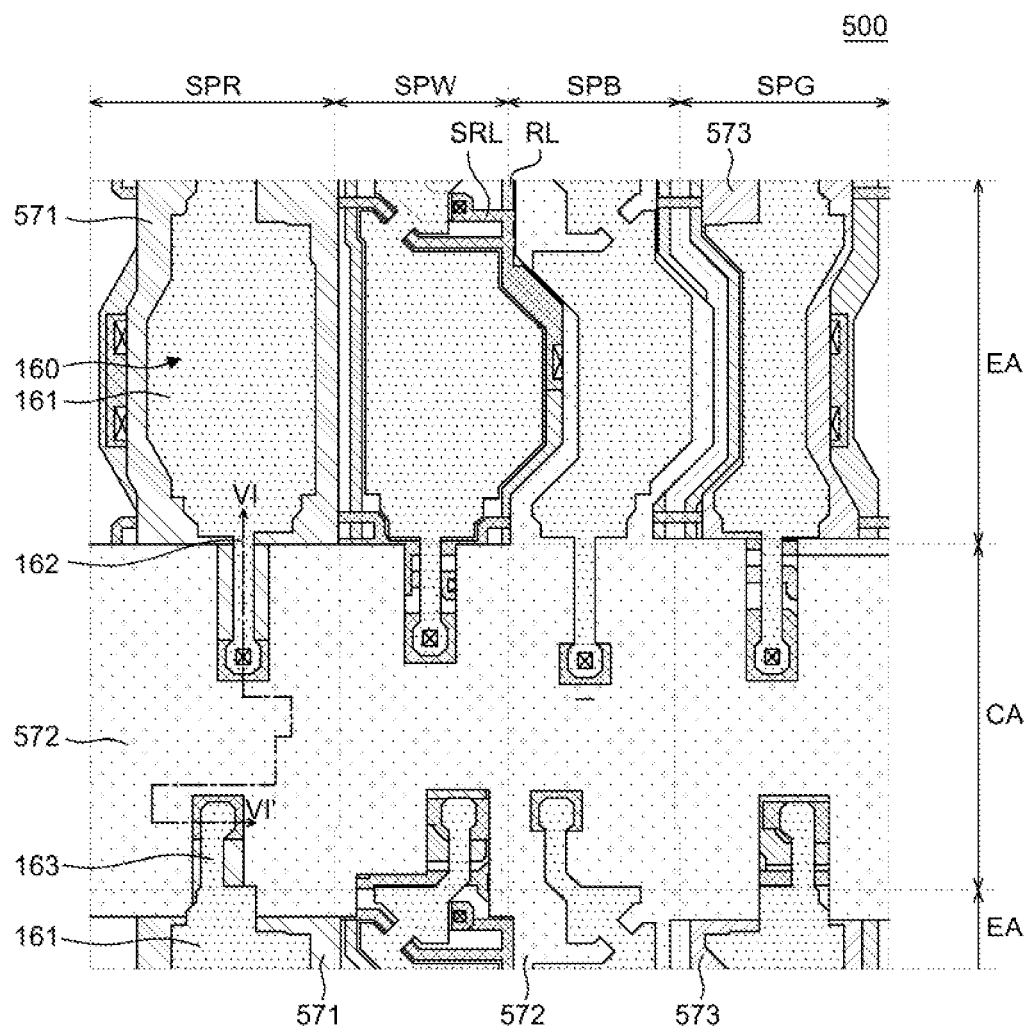
FIG. 5 is an enlarged plan view of a display device according to another aspect of the present disclosure.
Figure 6:
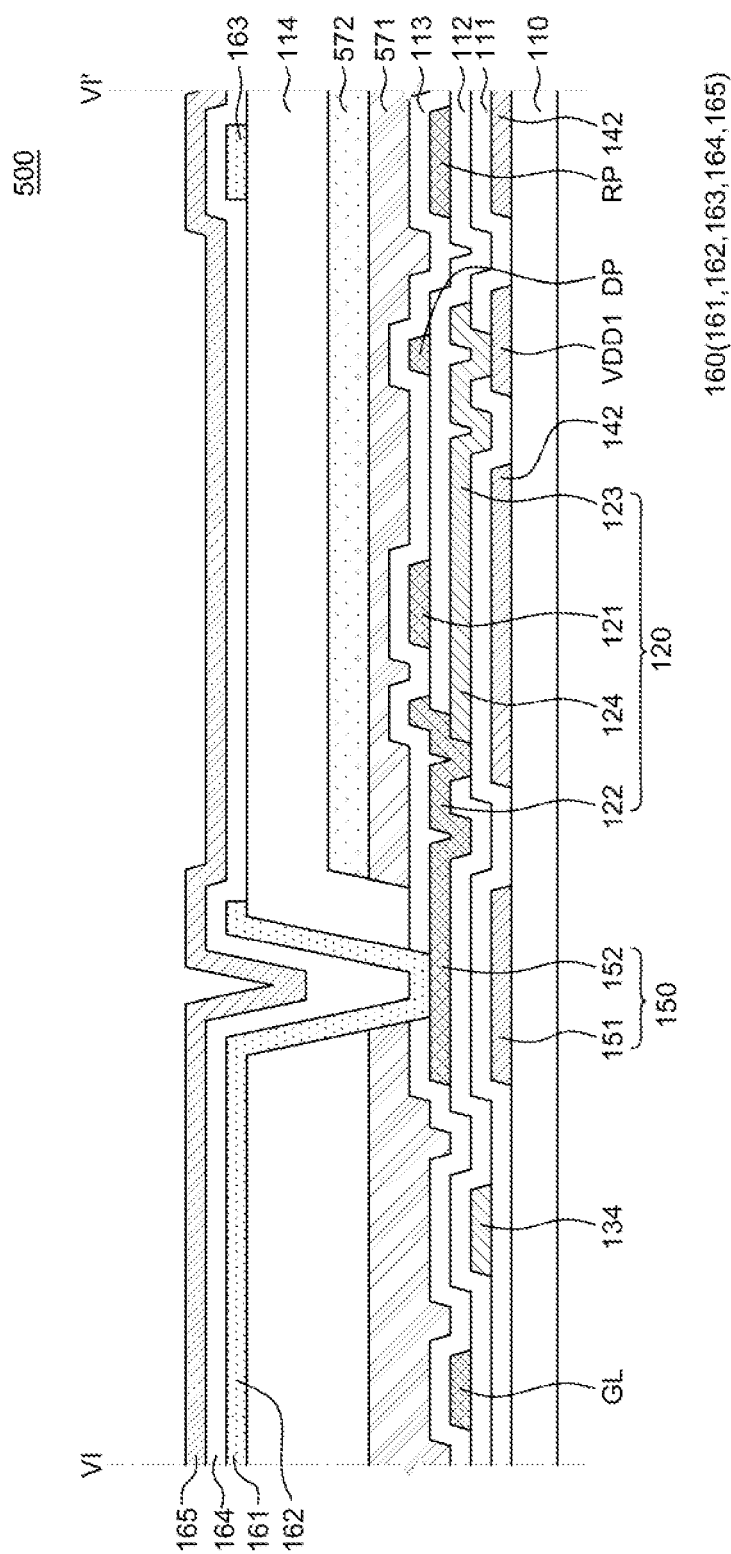
FIG. 6 is a cross-sectional view taken along line VI-VI' of FIG. 5.

FIG. 5 is an enlarged plan view of a display device according to another exemplary aspect of the present disclosure. FIG. 6 is a cross-sectional view taken along line VI-VI' of FIG. 5. A display device 500 of FIGS. 5 and 6 is different from the display device 100 of FIGS. 1 to 4 only in terms of further including a plurality of color filters 570, and other configurations thereof are substantially the same as those of the display device 100 of FIGS. 1 to 4. Thus, a duplicate description will be omitted.

With reference to FIGS. 5 and 6, the plurality of color filters 570 are disposed under the planarization layer 114 and the light emitting element 160. Specifically, the plurality of color filters 570 may be disposed between the planarization layer 114 and the passivation layer 113. The plurality of color filters 570 include a first color filter 571, a second color filter 572 and a third color filter 573. For example, the first color filter 571 may be a red color filter, the second color filter 572 may be a blue color filter, and the third color filter 573 may be a green color filter.

The first color filter 571 is disposed between the substrate 110 and the planarization layer 114 in the emission area EA of one sub-pixel SP of the plurality of sub-pixels SP and is disposed between the first transistor 120 and the planarization layer 114 in the circuit area CA of the one sub-pixel SP. For example, the first color filter 571 is a red color filter, and the first color filter 571 may be disposed between the substrate 110 and the planarization layer 114 in the emission area EA of the red sub-pixel SPR and may be disposed between the planarization layer 114 and the first transistor 120 in the circuit area CA of the red sub-pixel SPR. The first color filter 571 may be disposed between the substrate 110 and the planarization layer 114 in the circuit area CA of each of the white sub-pixel SPW, the blue sub-pixel SPB, and the green sub-pixel SPG, in addition to the red sub-pixel SPR. Therefore, the first color filter 571 disposed in the emission area of the red sub-pixel SPR of the plurality of sub-pixels SP and the circuit area CA of each of the plurality of sub-pixels SP may be formed to have a mesh shape.

The second color filter 572 is disposed between the substrate 110 and the planarization layer 114 in the emission area EA of another sub-pixel SP of the plurality of sub-pixels SP, is disposed between the first transistor 120 and the planarization layer 114 in the circuit area CA of another sub-pixel SP, and is disposed between the first color filter 571 and the planarization layer 114 in the circuit area CA of the one sub-pixel SP. For example, the second color filter 572 is a blue color filter. The second color filter 572 is disposed between the substrate 110 and the planarization layer 114 in the emission area EA of the blue sub-pixel SPB, is disposed between the planarization layer 114 and the first transistor 120 in the circuit area CA of the blue sub-pixel SPB, and is disposed between the first color filter 571 and the planarization layer 114 in the circuit area CA of the red sub-pixel SPR. In addition, the second color filter 572 may be disposed between the substrate 110 and the planarization layer 114 in the circuit area CA of each of the white sub-pixel SPW and the green sub-pixel SPG, in addition to the circuit areas CA of the blue sub-pixel SPB and the red sub-pixel SPR. Accordingly, the second color filter 572 disposed in the emission area of the blue sub-pixel SPB and the plurality of sub-pixels SP and the circuit area CA of each of the plurality of sub-pixels SP may be formed to have a mesh shape.

Also, the first color filter 571 and the second color filter 572 disposed in the circuit area CA of each of the plurality of sub-pixels SP may partially overlap each other. In the respective circuit areas CA of the plurality of sub-pixels SP, the first color filter 571 may be disposed between the substrate 110 and the planarization layer 114, and the second color filter 572 may be disposed between the first color filter 571 and the planarization layer 114. Therefore, the first color filter 571 and the second color filter 572 may be disposed to overlap each other in the respective circuit areas CA of the plurality of sub-pixels SP.

Meanwhile, it is illustrated that the first color filter 571 and the second color filter 572 are disposed to overlap each other in the respective circuit areas CA of the plurality of sub-pixels SP, but this is only an arrangement according to a process order. Types of the plurality of color filters 570 stacked on the circuit areas CA are not limited thereto. For example, in a case where the third color filter 573 and the first color filter 571 are sequentially formed on the passivation layer 113, the third color filter 573 and the first color filter 571 may also be disposed and stacked in the entirety of the respective circuit areas CA of the plurality of sub-pixels SP.

The third color filter 573 is disposed in the emission area EA of another sub-pixel SP of the plurality of sub-pixels SP. For example, the third color filter 573 is a green color filter, and the third color filter 573 is disposed between the substrate 110 and the planarization layer 114 in the emission area EA of the green sub-pixel SPG. In this case, instead of the third color filter 573, the first color filter 571 and the second color filter 572 may be disposed in the circuit area CA of the green sub-pixel SPG. Therefore, since the third color filter 573 is disposed only in the emission area EA of the green sub-pixel SPG, the third color filter 573 may be formed to have an island shape.

In the display device 500 according to another aspect of the present disclosure, at least a portion of the plurality of color filters 570 may be stacked in the circuit areas CA, thereby minimizing a parasitic capacitance between the first capacitor electrode 151 and the second electrode 165. First, since the display device 500 according to another exemplary aspect of the present disclosure is a bottom emission type, light emitted from the light emitting element 160 is emitted to the bottom portion of the substrate 110. Accordingly, the plurality of color filters 570 may be disposed between the light emitting elements 160 and the substrate 110 to convert a color of light emitted from the light emitting element 160 into various colors. In this case, each of the plurality of color filters 570 is not disposed only in the emission area EA, but is further arranged in the circuit area CA, so that a separation distance between the first capacitor electrode 151 and the second electrode 165 may increase. For example, the first color filter 571 of the plurality of color filters 570 may be disposed between substrate 110 and the planarization layer 114, that is, between the light emitting element 160 and the storage capacitor 150, in the emission area of the red sub-pixel SPR and the entirety of the circuit areas CA of the plurality of sub-pixels SP. In addition, the second color filter 572 of the plurality of color filters 570 may be disposed between the substrate 110 and the planarization layer 114 in the emission area EA of the blue sub-pixel SPB, and may be disposed between the light emitting element 160 and the storage capacitor 150 in the entirety of the circuit areas CA of the plurality of sub-pixels SP. Therefore, the first color filter 571 and the second color filter 572 are further disposed between the storage capacitor 150 and the second electrode 165 in the circuit area CA, so that the distance between the first capacitor electrode 151 and the second electrode 165 may increase, and a parasitic capacitance between the first capacitor electrode 151 and the second electrode 165 may also be minimized. Therefore, in the display device 500 according to another exemplary aspect of the present disclosure, at least one color filter 570 is further disposed between the storage capacitor 150 and the second electrode 165 in the circuit area CA, so that the distortion of a data signal due to a parasitic capacitance between the first capacitor electrode 151 and the second electrode 165 can be minimized.

The exemplary aspects of the present disclosure can also be described as follows:

According to an aspect of the present disclosure, a display device comprises a substrate in which a plurality of sub-pixels are defined, each of the plurality of sub-pixels including an emission area and a circuit area; a driving transistor disposed in the circuit area and including a first gate electrode and a first source electrode disposed on the same layer; a storage capacitor disposed in the circuit area and including a first capacitor electrode electrically connected to the first gate electrode and disposed below the first gate electrode; an insulating layer planarizing upper portions of the driving transistor and the storage capacitor; and a light emitting element disposed on the insulating layer.

The first capacitor electrode may overlap the first source electrode, and the storage capacitor may further include a second capacitor electrode integrally formed with the first source electrode.

The second capacitor electrode may be disposed on the first capacitor electrode.

The light emitting element may include a first electrode disposed in the emission area, on the insulating layer; a light emitting layer disposed in an entirety of the emission area and the circuit area, on the first electrode; and a second electrode disposed in the entirety of the emission area and the circuit area, on the light emitting layer, wherein, in an upper surface of the insulating layer, a remaining portion excluding a portion contacting the first electrode may be in contact with the light emitting element.

The first electrodes disposed in the plurality of respective sub-pixels may be disposed to be spaced apart from each other, and the light emitting layer may be disposed between the first electrodes spaced apart from each other.

The light emitting element may further include an extension portion extending from the first electrode of the emission area toward the first source electrode of the circuit area.

The light emitting element may further include a repair portion extending from the first electrode disposed in one sub-pixel of the plurality of sub-pixels toward the circuit area of another sub-pixel adjacent to the one sub-pixel.

The display device may further comprise a light blocking layer disposed between the substrate and a first active layer of the driving transistor, and the first capacitor electrode may be disposed on the same layer as the light blocking layer.

The display device may further comprise a switching transistor disposed in the circuit area, and including a second source electrode electrically connected to the first gate electrode and the first capacitor electrode; a sensing transistor disposed in the circuit area, and including a third source electrode electrically connected to the driving transistor, the storage capacitor, and the light emitting element; a gate line electrically connected to a second gate electrode of the switching transistor; a data line electrically connected to a second drain electrode of the switching transistor; a high potential power supply line electrically connected to a first drain electrode of the driving transistor; a sensing line electrically connected to a third gate electrode of the sensing transistor; and a reference line electrically connected to a third drain electrode of the sensing transistor, wherein the data line, the high potential power supply line, and the sensing line may be disposed to extend in a column line on the same layer as the light blocking layer, wherein the gate line and the reference line may be disposed to extend in a row direction on the same layer as the first gate electrode.

The display device may further comprise a first color filter disposed between the substrate and the insulating layer in the emission area of one sub-pixel of the plurality of sub-pixels, and disposed between the driving transistor and the insulating layer in the circuit area of the one sub-pixel; and a second color filter disposed between the substrate and the insulating layer in the emission area of another sub-pixel of the plurality of sub-pixels, and disposed between the first color filter and the insulating layer in the circuit area of the one sub-pixel.

The first capacitor electrode, the first color filter, and the second color filter may overlap each other in the circuit area of the one sub-pixel.

According to another aspect of the present disclosure, a display device comprises a substrate in which a plurality of sub-pixels including a red sub-pixel, a green sub-pixel, a blue sub-pixel and a white sub-pixel are defined; a first capacitor electrode disposed in each of the plurality of sub-pixels; a driving transistor disposed in each of the plurality of sub-pixels and including a first gate electrode electrically connected to the first capacitor electrode and a first source electrode disposed on the first capacitor electrode; and a light emitting element including a plurality of anodes disposed on the driving transistor in each of the plurality of sub-pixels, and a light emitting layer and a cathode disposed on the entirety of the plurality of sub-pixels so as to cover the plurality of anodes, wherein a portion of a lower surface of the light emitting layer may be disposed on a same plane as respective lower surfaces of the plurality of anodes.

Each of the plurality of sub-pixels may further include an emission area in which the plurality of anodes are disposed; and a circuit area in which the driving transistor and the first capacitor electrode are disposed, wherein the light emitting element further may include an extension portion extending from each of the plurality of anodes toward the driving transistor.

The light emitting element may further include a repair portion extending from an anode disposed in the red sub-pixel among the plurality of anodes toward another red sub-pixel adjacent to the red sub-pixel.

The display device may further comprise a red color filter disposed in the emission area of the red sub-pixel among the emission areas, and the circuit area of each of the plurality of sub-pixels; a blue color filter disposed in the emission area of the blue sub-pixel among the emission areas, and the circuit area of each of the plurality of sub-pixels; and a green color filter disposed in the emission area of the green sub-pixel among the emission areas, wherein in the circuit area of each of the plurality of sub-pixels, the red color filter and the blue color filter may overlap each other.

The red color filter and the blue color filter may be formed to have a mesh shape, wherein the green color filter may be formed to have an island shape.

The first capacitor electrode and the first source electrode may constitute a storage capacitor, and the first source electrode, the red color filter, and the blue color filter may be disposed between the first capacitor electrode and the cathode.

The first capacitor electrode may be disposed closest to the substrate among conductive components disposed on the substrate.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a substrate in which a plurality of sub-pixels including a red sub-pixel, a green sub-pixel, a blue sub-pixel and a white sub-pixel are defined;
a first capacitor electrode disposed in each of the plurality of sub-pixels;
a driving transistor disposed in each of the plurality of sub-pixels and including a first gate electrode electrically connected to the first capacitor electrode and a first source electrode disposed on the first capacitor electrode; and
a light emitting element including a plurality of anodes disposed on the driving transistor in each of the plurality of sub-pixels, and a light emitting layer and a cathode disposed on the entirety of the plurality of sub-pixels so as to cover the plurality of anodes,
wherein a portion of a lower surface of the light emitting layer is disposed on a same plane as lower surfaces of the plurality of anodes,
wherein each of the plurality of sub-pixels further includes,
an emission area in which the plurality of anodes are disposed; and
a circuit area in which the driving transistor and the first capacitor electrode are disposed,
wherein the light emitting element further includes an extension portion extending from each of the plurality of anodes toward the driving transistor.

2. The display device of claim 1, wherein the light emitting element further includes a repair portion extending from an anode disposed in the red sub-pixel among the plurality of anodes toward another red sub-pixel adjacent to the red sub-pixel.

3. The display device of claim 1, further comprising:
a red color filter disposed in the emission area of the red sub-pixel among the emission areas, and the circuit area of each of the plurality of sub-pixels;
a blue color filter disposed in the emission area of the blue sub-pixel among the emission areas, and the circuit area of each of the plurality of sub-pixels; and
a green color filter disposed in the emission area of the green sub-pixel among the emission areas,
wherein in the circuit area of each of the plurality of sub-pixels, the red color filter and the blue color filter overlap with each other.

4. The display device of claim 3, wherein the red color filter and the blue color filter have a mesh shape, and the green color filter has an island shape.

5. The display device of claim 3, wherein the first capacitor electrode and the first source electrode constitute a storage capacitor, and the first source electrode, the red color filter, and the blue color filter are disposed between the first capacitor electrode and the cathode.

6. A display device, comprising:
a substrate in which a plurality of sub-pixels including a red sub-pixel, a green sub-pixel, a blue sub-pixel and a white sub-pixel are defined;
a first capacitor electrode disposed in each of the plurality of sub-pixels;
a driving transistor disposed in each of the plurality of sub-pixels and including a first gate electrode electrically connected to the first capacitor electrode and a first source electrode disposed on the first capacitor electrode; and
a light emitting element including a plurality of anodes disposed on the driving transistor in each of the plurality of sub-pixels, and a light emitting layer and a cathode disposed on the entirety of the plurality of sub-pixels so as to cover the plurality of anodes,
wherein a portion of a lower surface of the light emitting layer is disposed on a same plane as lower surfaces of the plurality of anodes,
wherein the first capacitor electrode is disposed closest to the substrate among conductive components disposed on the substrate.

* * * * *